United States Patent [19]
Horiguchi et al.

[11] Patent Number: 5,910,675
[45] Date of Patent: Jun. 8, 1999

[54] SEMICONDUCTOR DEVICE AND METHOD OF MAKING THE SAME

[75] Inventors: Yoko Horiguchi; Kaoru Narita; Takeo Fujii, all of Tokyo, Japan

[73] Assignee: NEC Corporation, Tokyo, Japan

[21] Appl. No.: 08/763,513

[22] Filed: Dec. 11, 1996

[30] Foreign Application Priority Data

Dec. 14, 1995 [JP] Japan .................................. 7-325911

[51] Int. Cl.⁶ .................................................. H01L 29/72
[52] U.S. Cl. ........................ 257/370; 257/355; 257/360; 257/362; 257/378; 257/409; 257/487; 257/577
[58] Field of Search ................................. 257/370, 355, 257/360, 362, 378, 409, 487, 577

[56] References Cited

U.S. PATENT DOCUMENTS 5,449,939  9/1995  Horiguchi et al. .
5,679,972  10/1997  Kim ...................................... 257/370

FOREIGN PATENT DOCUMENTS

63-202056  8/1988  Japan .

Primary Examiner—Edward Wojciechowicz
Attorney, Agent, or Firm—McGinn & Gibb, P.C.

[57] ABSTRACT

A semiconductor device includes a metal terminal provided on a semiconductor substrate and a protection element. The protection element includes an insulated gate field-effect transistor. The transistor has a first diffusion layer of a reverse conductive-type formed on one conductive type region of the semiconductor substrate and connected to the metal terminal, as its source. The transistor also includes a second diffusion layer of a reverse conductive-type connected to an electrode wire having a constant electric potential, as its source, and has a gate electrode connected to the electrode wire. A lateral bipolar transistor includes a third diffusion layer of a reverse conductive-type formed with a constant spaced distance with respect to the second diffusion layer and connected to the metal terminal, as its collector, and also has the second diffusion layer as its emitter, and furthermore has the one conductive-type region as its base. Thus, a semiconductor device is protected from an electrostatic discharge (ESD) breakdown device even though having high density and a high operating speed.

17 Claims, 6 Drawing Sheets

SEMICONDUCTOR DEVICE AND METHOD OF MAKING THE SAME

BACKGROUND OF THE INVENTION

The present invention relates to a semiconductor device, and more particularly to a semiconductor device having electrostatic protection elements for protecting an internal circuit from electrostatic breakdown.

DESCRIPTION OF THE RELATED ART

A semiconductor integrated circuit which is formed on a semiconductor substrate includes a wide variety of semiconductor elements. These semiconductor elements must be protected from breakdown due to an excessively high input voltage applied instantaneously and externally, such as a pulsed high voltage generated due to static electricity (e.g., electrostatic force).

Hitherto the invention, various techniques have been used for protecting semiconductor elements of a semiconductor integrated circuit from an electrostatic breakdown phenomenon.

However, with the ever-increasing integration of semiconductor devices and reduction in the dissipation power of the operating voltage, the structure of the semiconductor elements which form the semiconductor device has been reduced in size to meet the fine and high-density requirements. Generally, the electrostatic breakdown of the fine and high-density semiconductor elements easily occurs.

A technique (hereinafter referred to as a first conventional example) disclosed in Japanese Patent Application Laid-Open No. 63-202056 and a well-known technique (hereinafter referred to as a second conventional example) will be described as conventional techniques for protecting semiconductor elements from electrostatic breakdown.

Figure 11A:
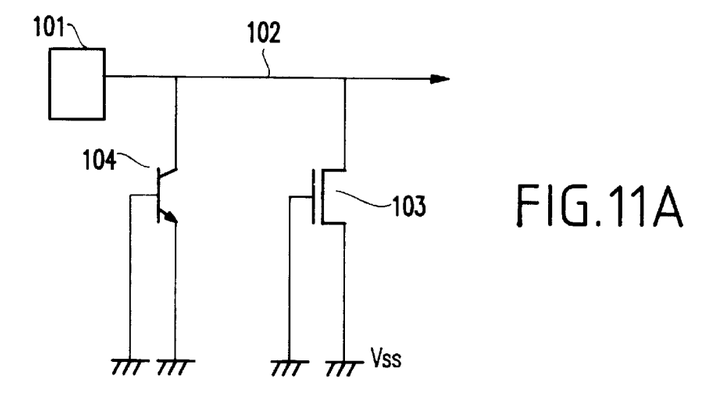
FIGS. 11(a) and 11(b) show a circuit diagram of a conventional input-output protection circuit and a sectional view of the circuit, respectively.
Figure 11B:
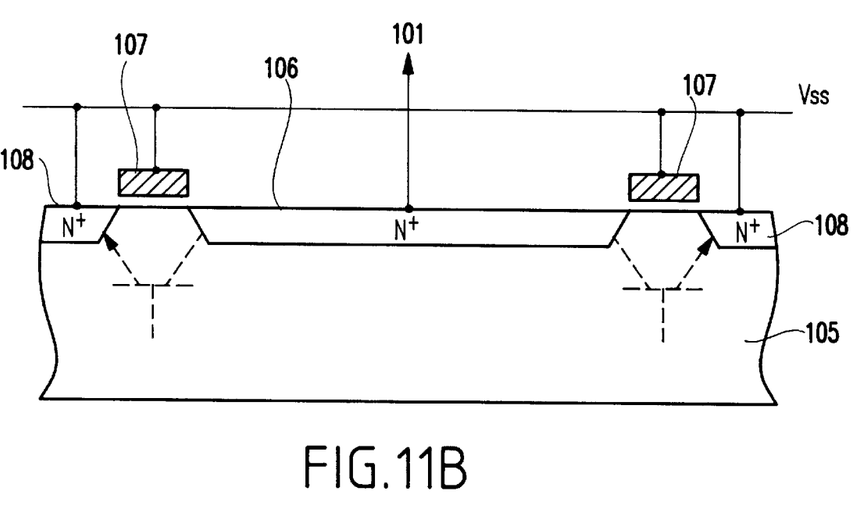

FIG. 11(a) shows an input protection circuit for a semiconductor device of the first conventional example, whereas FIG. 11(b) shows the cross-sectional structure of the semiconductor elements forming the semiconductor device and being protected by the input protection circuit.

As shown in FIG. 11(a), an input wire 102 has a first end connected to an input terminal 101, and also is connected to the input gate of the internal circuit of the semiconductor device.

Specifically, an input-protection N-channel metal oxide semiconductor (MOS) transistor 103 is connected to the input wire 102 as an electrostatic protection transistor between the input wire 102 and an electric potential of $V_{SS}$ (GND potential). The gate of the input-protection N-channel MOS transistor 103 is fixed to the electric potential of $V_{SS}$.

A protection circuit as above is formed by a single, relatively large MOS transistor. However, if a high pulse voltage is applied the MOS transistor, it performs a bipolar operation because of the "snap-back" effect (described in more detail below). Thus, FIG. 11(a) shows a parasitic NPN transistor 104 as if it is placed between the input wire 102 and $V_{SS}$ potential.

As shown in the cross-sectional view of FIG. 11(b), the input-protection N-channel MOS transistor 103, which is a single MOS transistor actually forming the protection circuit, is provided on a semiconductor substrate 105 where the conductive-type surface is a P-channel. A gate electrode 107 is formed so as to surround a drain $N^+$ diffusion layer 106 connected to the input terminal 101, and a source $N^+$ diffusion layer 108 is formed so as to surround the gate electrode 107.

In this case, a parasitic NPN transistor 104 is operationally (e.g., effectively) formed as shown by broken lines in FIG. 11(b). In this case, the semiconductor substrate 105 becomes the base of the parasitic NPN transistor 104, the source $N^+$ diffusion layer 108 becomes the emitter, and the drain $N^+$ diffusion layer 106 becomes the collector. The source $N^+$ diffusion layer 108 is connected to $V_{SS}$, and an input terminal formed by a metal pad is formed on the drain $N^+$ diffusion layer 106.

In this way, in the first conventional example a single, large MOS transistor is formed as a semiconductor element for input protection.

Hereinbelow and referring to FIG. 12, an input protection circuit of the second conventional example is described.

Figure 12:
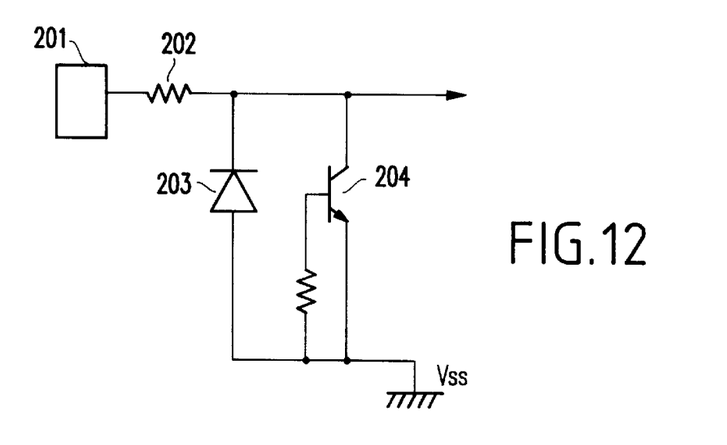
FIG. 12 is a circuit diagram of a second conventional input-output protection circuit.

As shown in FIG. 12, a resistance wire 202 is connected to an input terminal 201. Then, the resistance wire 202 is connected to the input gate of the internal circuit of a semiconductor device.

An input-protection (PN) diode 203 and an NPN transistor 204 are connected so as to be parallel to one another between the resistance wire 202 and an electric potential of $V^{ss}$.

Although not shown in FIG. 12, the NPN transistor 204 is formed by long and thin $N^+$ diffusion layers which are adjacent to each other and formed in parallel on a semiconductor substrate where the conductive-type surface is a P-channel. This NPN transistor is a lateral bipolar transistor. One diffusion layer is the emitter, the other diffusion layer is the collector, and the surface of the semiconductor substrate where the conductive-type surface between the layers is a P-channel.

Additionally, the input-protection PN diode 203 is formed by the aforementioned other $N^+$ diffusion layer and semiconductor substrate. In this way, the circuit of FIG. 12 is formed.

As described above, the semiconductor device is highly integrated and operates at high-speed. Hence, the individual semiconductor elements which form the semiconductor device are even more finely formed with high density. Thus, if the semiconductor element is small, a defect in the semiconductor device will occur frequently due to electrostatic discharge (ESD).

Additionally, reduced dissipation power of the semiconductor device is required, and reducing voltage when the device is operated is becoming important. Thus, if the voltage is reduced, then the semiconductor elements which form the internal circuit of the semiconductor device will be easily breakable even if there is a small quantity of static electricity or a small excessive input voltage, as compared with existing semiconductor elements.

Given the technical advances in industry, a technique of protecting semiconductor elements from the aforementioned electrostatic discharge is urgently required.

In the aforementioned first conventional example, a single large MOS transistor is formed around the input terminal 101 as a protective element. When an excessive input voltage is applied to the drain $N^+$ diffusion layer 106 through the input terminal 101, a breakdown will occur in the PN junction between the drain $N^+$ diffusion layer 106 just under the gate electrode 107 and the semiconductor substrate 105. A large plurality of positive holes which are a great number of carriers are generated by the breakdown. These positive holes pull the substrate potential up to a positive side, and the MOS transistor is operated due to the "snap-back" effect. Then, the excessive input voltage is discharged to protect the circuit.

However, in this conventional example the insulation breakdown of the gate insulation film of the MOS transistor frequently occurs. Particularly, this frequency of insulation breakdown increases as the gate insulation film and semiconductor elements are made smaller.

The reason for the insulation breakdown easily occurring is believed to be as follows. When the aforementioned excessive input voltage is discharged, a large plurality of positive holes are introduced into the gate insulation film from the semiconductor substrate where the positive holes are formed and shifted to a positive side. The positive holes collect in the gate insulation film, and therefore an excessive voltage is applied to the gate insulation film which causes the breakdown to occur more easily than it would otherwise.

Additionally, in the NPN transistor 204 of the second conventional example, a pair of N+ diffusion layers which are selectively provided on the semiconductor substrate function as the emitter region and the collector region, respectively, and the semiconductor substrate between these regions functions as the base region. When an excessive input voltage is applied to an input terminal, the base potential rises due to the positive holes which are generated due to the avalanche breakdown of the PN junction, and the NPN transistor is operated. Then, the excessive input voltage is discharged through the NPN transistor.

However, the starting of the NPN transistor, which is a lateral bipolar transistor, takes longer than a MOS transistor (which is similar to the first conventional example). Since the semiconductor elements which form the internal circuit are decreasing in size, the need for quick response becomes even more important. Therefore, the smaller, quicker semiconductor elements of the state-of-the-are internal circuits may easily breakdown before the protective elements are operated.

Additionally, in this case, the above protective elements cannot respond if an excessive input voltage is small, since reducing the avalanche breakdown voltage of the PN junction is difficult.

As described above, when the semiconductor elements which form the internal circuit of the semiconductor device are made small, the gate length is reduced, and the film thickness of the gate insulation film is reduced. Therefore, the semiconductor elements sufficiently respond to a small pulsed voltage, and an ESD breakdown can easily occur.

Another technique of protecting the output transistor and internal circuit of a semiconductor device from an ESD breakdown is disclosed in U.S. Pat. No. 5,449,939, commonly assigned with the present application, in which the input-output protection element is a bipolar transistor. Additionally, the effective channel length of the output transistor is set to be longer than the effective base length of the bipolar transistor. However, this technique is disadvantageous because shrinking the distance between the first breakdown point and the bipolar transistor is difficult. This results in the turn-on delay of the bipolar device.

SUMMARY OF THE INVENTION

In view of the foregoing problems of the conventional devices, it is an object of the present invention to provide a semiconductor device for protecting highly integrated semiconductor elements of an internal circuit, from electrostatic breakdown by a circuit construction having a minimum pattern area.

According to a first aspect of the present invention, a semiconductor device of the present invention includes a metal terminal provided on a semiconductor substrate, an insulated gate field-effect transistor which has at least one first diffusion layer of a reverse conductive-type formed on one conductive-type region of the semiconductor substrate and connected to the metal terminal, and at least one second diffusion layer of a reverse conductive-type connected to an electrode wire having a constant electric potential and also which has part of the first diffusion layer as its drain and part of the second diffusion layer as its source and has a gate electrode connected to the electrode wire. Further, a lateral bipolar transistor is provided where another part of the first diffusion layer and another part of the second diffusion layer are formed with a constant spaced distance and which has another part of the first diffusion layer as its collector, another part of the second diffusion layer as its emitter, and the one conductive-type region as its base.

In a second aspect of the present invention, a semiconductor device includes a metal terminal provided on a semiconductor substrate, an insulated gate field-effect transistor which has a first diffusion layer of a reverse conductive-type formed on one conductive-type region of the semiconductor substrate and connected to the metal terminal, as its drain, and also has a second diffusion layer of a reverse conductive-type connected to an electrode wire having a constant electric potential, as its source, and has a gate electrode connected to the electrode wire, and a lateral bipolar transistor which has a third diffusion layer of a reverse conductive-type formed with a constant spaced distance with respect to the second diffusion layer and connected to the metal terminal, as its collector, and also has the second diffusion layer as its emitter, and furthermore has the one conductive type region as its base.

In a third aspect of the present invention, in a semiconductor device an electrostatic protection transistor and a semiconductor element for starting the electrostatic protection transistor are formed on a semiconductor substrate adjacent to one another. The electrostatic protection transistor has its collector connected to a metal terminal, its emitter connected to an electrode wire having a constant electric potential, and its base connected to the emitter through a resistor. The electrostatic protection transistor preferably includes a lateral bipolar transistor, and the semiconductor element preferably includes an insulated gate field-effect transistor and a gate control diode.

In a fourth aspect of the present invention, a semiconductor device pattern layout, is provided which includes a first region coupled to a terminal; a second region coupled to a discharging line; a gate electrode cooperating with the first and second regions, to provide a metal oxide semiconductor (MOS) transistor; and a third region coupled to the terminal and provided adjacent to the MOS transistor.

With the unique and unobvious structure and method of the present invention, as described above, if an excessive input voltage is applied to a terminal, a semiconductor element such as a small trigger MOS transistor will be operated first. Then, the start of the semiconductor element triggers the operation of an electrostatic protection transistor, and a discharge is performed in correspondence with the excessive input voltage.

Thus, a semiconductor element, such as a trigger MOS transistor, actuates an electrostatic protection transistor such as an NPN transistor. However, the trigger MOS transistor does not discharge the excessive input voltage. Instead, the discharge of the excessive input voltage is performed through the electrostatic protection transistor which has a low resistance path as a result of the trigger MOS transistor.

Additionally, this structure does not need additional fabrication process steps, such as ion implantation and lithography. Only a conventional CMOS fabrication process is required.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 1:
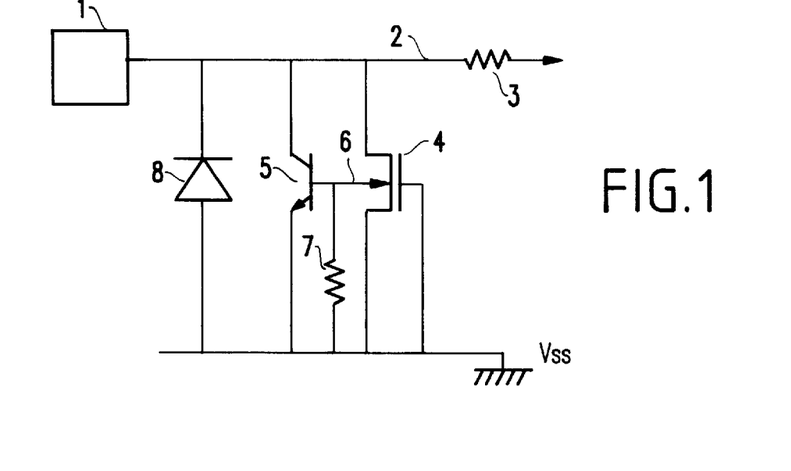
FIG. 1 is a circuit diagram of an input-output protection circuit according to a first embodiment of the present invention.
Figure 2:
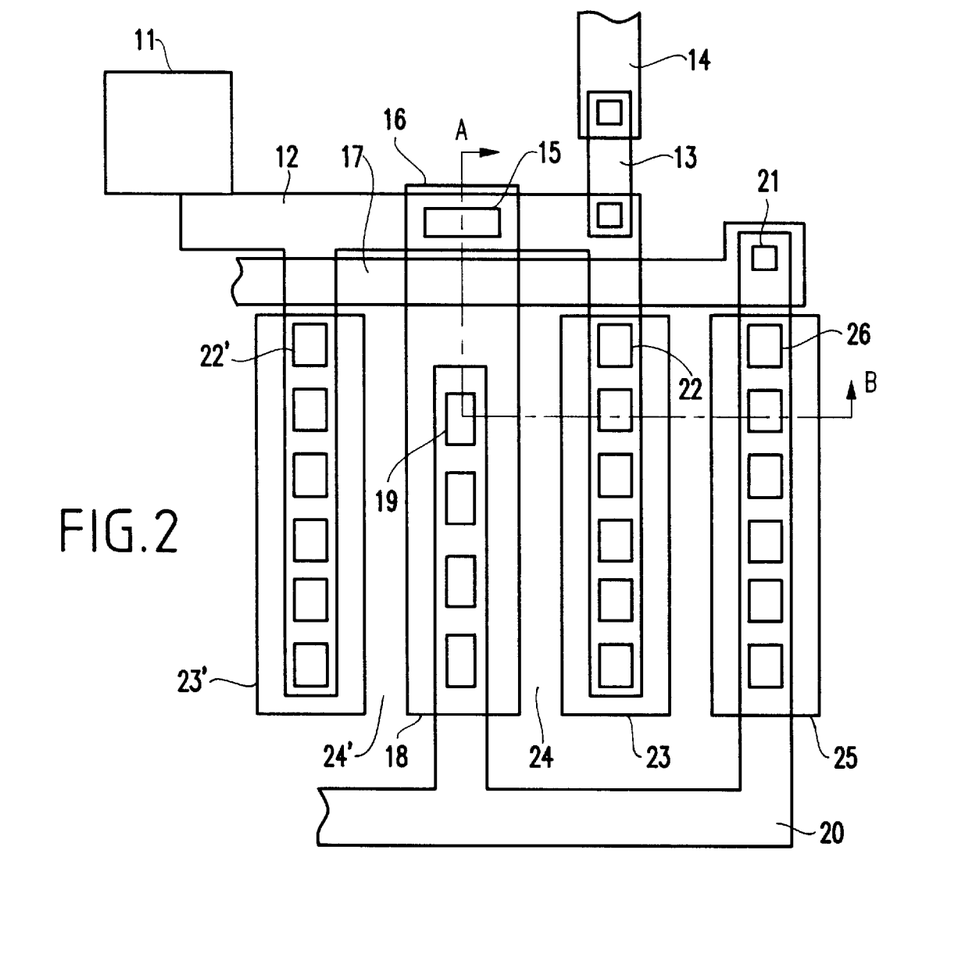
FIG. 2 is a pattern layout diagram of the input-output protection circuit of the first embodiment shown in FIG. 1.
Figure 3:
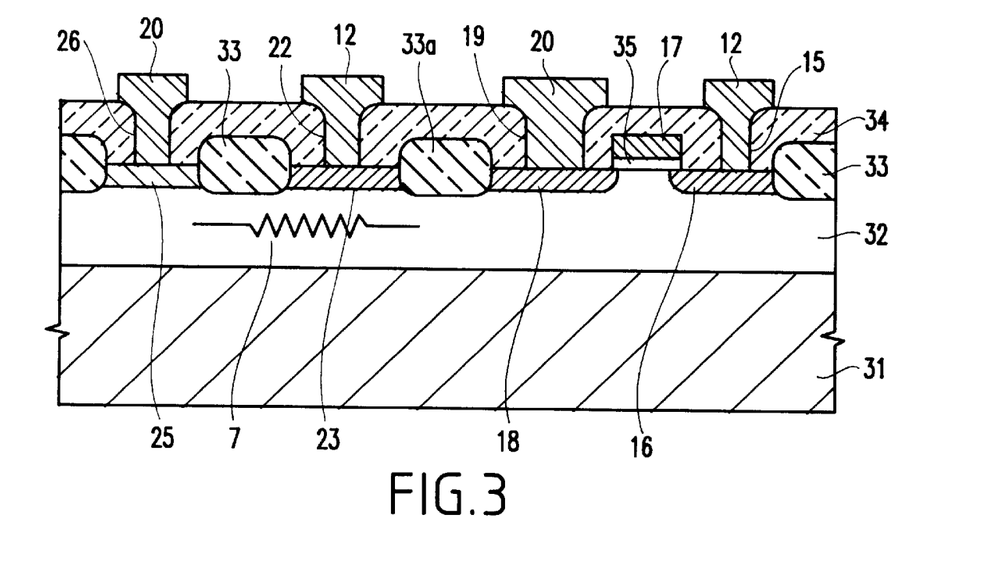
FIG. 3 is a sectional view of the input-output protection circuit of the first embodiment shown in FIG. 1.

Referring now to the drawings, there are shown embodiments of the present invention which will be described. FIGS. 1–3 illustrate a first embodiment of the present invention. FIG. 1 shows an equivalent circuit diagram of an input-output protection circuit, FIG. 2 shows the pattern layout diagram, and FIG. 3 is a sectional view taken along line A-B shown in FIG. 2.

As shown in FIG. 1, an input-output line 2 is connected to an input-output (I/O) terminal 1, and to an input gate of an internal circuit of a semiconductor device through an input resistor 3. It is noted that while the terminal 1 is described as an I/O terminal, the terminal 1 can be, for example, a power supply terminal, a ground terminal or the like.

A trigger MOS transistor 4, which preferably is an insulated-gate field-effect transistor (IGFET), is connected between the input-output line 2 and a ground wire (e.g., an electric potential of $V_{SS}$). Instead of the IGFET, a Zener diode alternatively could be employed and also would provide suitable results. A gate of the trigger MOS transistor 4 is fixed to the $V_{SS}$ potential.

Additionally, an NPN transistor 5 is connected to the input-output line 2 as an electrostatic protection transistor in parallel to the trigger MOS transistor 4. A back gate 6 of the trigger MOS transistor 4 is connected to the base of the NPN transistor 5 through a well layer or semiconductor substrate described below. The back gate 6 is connected to the $V_{SS}$ potential through a back gate resistor 7. Furthermore, the emitter of the NPN transistor 5 is connected to the $V_{SS}$ potential.

A PN diode 8 is connected to the input-output line 2 in parallel to the trigger MOS transistor 4 and the NPN transistor 5.

Thus, input-output protection elements, which are disposed in parallel between the input-output line 2 connected from the input-output terminal 1 to an internal circuit and the $V_{SS}$ potential, are formed. These protection elements form an input-output protection circuit.

Hereinbelow, a pattern layout of the input-output protection circuit is described referring to FIG. 2.

As shown in FIG. 2, an input-output wire 12 which is connected to an input-output pad 11 is formed. The wire 12 and pad 11 are preferably formed by aluminum metal or an alloy thereof. Other candidate materials for the wire 12 and pad 11 include W, WSi, Ti, and the like. The input-output wire 12 also is connected to a resistance wire 13 (preferably having a resistance within a range of 10 to 1 kΩ) through a contact hole, and furthermore, it is connected to an internal wire 14.

The input-output wire 12 is connected to a drain diffusion layer 16 through a drain contact hole 15. The trigger MOS transistor 4 is formed by a gate electrode 17 and a source diffusion layer 18. The source diffusion layer 18 is connected to a ground wire 20 through a source contact hole 19. The gate electrode 17 is connected to the ground wire 20 through a gate contact hole 21.

Further, the input-output wire 12 is connected to the collector diffusion layer 23 through a collector contact hole 22. Similarly, a collector diffusion layer 23' is formed so that the source diffusion layer 18 is interposed between the layers 23 and 23', and the collector diffusion layer 23' is also connected to the input-output wire 12 through a collector contact hole 22'. The NPN transistor 5 is formed by base regions 24 and 24' and collector diffusion layers 23 and 23', which are formed in parallel, with the source diffusion layer 18 as an emitter diffusion layer.

The base length of the base region 24 or 24' is the spaced distance between the source diffusion layer (emitter diffusion layer) 18 and the collector diffusion layer 23 or 23'. Additionally, the base width corresponds to the width in the longitudinal direction of the collector diffusion layer 23 or 23' shown in FIG. 2.

In the pattern layout described above, the trigger MOS transistor is designed to be small. That is, the gate width of the trigger MOS transistor is designed to be very small (¹/₂₀ to ¹/₁₀) as compared with the base width of the NPN transistor. However, the gate length of the trigger MOS transistor is designed to be longer than the base length of the NPN transistor ($L_{gate} \geq L_{base}$; $L_{gate}/L_{base}$=1 to 2). The channel length of the trigger MOS transistor is designed to be longer ($L_{eff}=L_{gate}-2L_d$, $L_d$=0.1–0.2 μm) than the base length of the NPN transistor. This condition/relationship provides the lower clamping voltage of the NPN trigger than that of the trigger MOS Tr. Therefore, most of the current flows through the NPN once it is triggered.

Additionally, a diode diffusion layer 25 is formed in parallel to the collector diffusion layer 23 and is connected to the ground wire 20 through a diode contact hole 26.

Referring now to FIG. 3, the present invention will be described with the sectional structure of the input-output protection portion shown in FIG. 2.

As shown in FIG. 3, a P-type well layer 32, preferably having a thickness of between 2 and 5 μm, is formed on the surface of a conductive N-type silicon substrate 31. The impurity concentration of the well layer 32 is set to about $10^{16}$ atoms/cm$^3$.

Thereafter, field insulation films 33 and 33a, having a preferred thickness within the range of 0.1–0.4 μm formed preferably of SiO$_2$, are selectively formed on the surface of the well layer 32 as an element separating region. The gate electrode 17 is formed through a gate insulation film 35 in the region where there is no field insulation film 33. The gate insulation film 35 has a thickness of within a range of 8–12 nm. Arsenic impurities with a high concentration (e.g., $10^{20}$ atom s/cm$^3$) are introduced into the gate electrode 17 in a self-matching manner, and the drain diffusion layer 16 and the source diffusion layer 18 are formed. Layers 16 and 18 have a preferred thickness of within a range of about 0.1 and 0.3 μm, respectively.

Then, the input-output wire 12 is connected to the drain diffusion layer 16 through the drain contact hole 15 provided in the intervening insulation film 34, which has a thickness within a range of about 1 to 2 μm. The ground wire 20 is connected to the source diffusion layer (emitter diffusion layer) 18 through the source contact hole 19. In this way, the N-channel trigger MOS transistor 4 described in FIG. 1 is formed.

Additionally, the collector diffusion layer 23 is formed with a relatively high concentration (e.g., $10^{20}$ atoms/cm$^3$) of arsenic impurities. Then, the collector diffusion layer 23 is connected to the input-output wire 12 through the collector contact hole 22. In this way, the NPN transistor 5, which is a lateral bipolar transistor and has the emitter diffusion layer 18 and the collector diffusion layer 23, is formed with the well layer just under the field insulation film 33a as the base region 24.

Furthermore, the diode diffusion layer 25 is formed with a relatively high concentration (e.g., $10^{20}$ atoms/cm$^3$) of boron impurities, and has a preferred thickness within a range of about 0.1–0.4 um. The conductive-type of the diode diffusion layer 25 is the same P-type as the well layer 32, and is connected to the ground wire 20. In this way, the PN diode 8 is formed by the collector diffusion layer 23 and well layer 32 which preferably are N$^+$ type diffusion layers.

In the above structure, the back gate 6 described with regard to FIG. 1 is the well layer 32 of the region where the trigger MOS transistor 4 is formed, and this region is adjacent to the well layer 32 just under the field insulation film 33a which becomes the base region of the NPN transistor 5. Then, the back gate resistor 7 which is formed by the diffusion layer of the well layer 32 as shown in FIG. 3 is formed between the back gate 6 and the diode diffusion layer 25 fixed to the ground potential $V_{SS}$.

Hereinbelow, the operation of the input-output protection circuit according to the first embodiment of the present invention will be described while referring to FIGS. 1, 3, and 4.

If a positive excessive input voltage is applied to the input-output terminal 1 shown in FIG. 1, then the trigger MOS transistor 4 will be operated first by this excessive input voltage.

In operation, a voltage is applied to the drain diffusion layer 16 through the input-output wire 12 shown in FIG. 3, and breakdown takes place at the joined portion just under the gate insulation film 35 (e.g., the channel end portion of the trigger MOS transistor). The breakdown generates a large plurality of positive holes, which pull the electric potential of the well layer 32 up to a positive side. Thus, the threshold voltage of the MOS transistor is reduced, and electrons flow from the source diffusion layer 18 to the drain diffusion layer 16. The electron flow further generates positive holes due to impact ionization.

Next, the NPN transistor is operated and the primary discharge of an excessive input voltage is performed through the NPN transistor.

When excessive voltage is applied to an I/O pad 11, the potential level of the P well layer 32 is raised, and the excess voltage is applied to the edges of the transistor to break them down and immediately apply it to the NPN transistor, and is dissipated to the ground wire 20. Preferably, two layers are formed to increase the ability to dissipate the excessive voltages. It is noted that the edge of the channel or gate of the trigger transistor 4 is formed relatively close to the base of the NPN (e.g., within a range of 1–5 μm).

Thus, electrons flow from the source diffusion layer (emitter diffusion layer) 18 into the base region, and flow into the collector diffusion layer 23. Even in this case, positive holes are generated due to the impact ionization of electrons, and the potential of the base region is further increased. Because a positive feedback control is performed in this way and the NPN transistor 5 is designed to have a very large dimension (e.g., 50–300 μm) as compared with the trigger MOS transistor 4, a relatively large surge current (e.g., on the order of 0.5–2.0 A (peak current)) flows through the NPN transistor 5. Thus, most of the discharge of an excessive input voltage is performed through the NPN transistor.

It is noted that a surge current as above selects and flows through a low resistance path. Hence, the resistor of a trigger MOS transistor per channel width is preferably higher than that of an NPN transistor per base width. Therefore, as described above, the channel length of the trigger MOS transistor is set to be longer than the base length of the NPN transistor.

Furthermore, the distance from the end of the contact hole of the drain of the trigger MOS transistor to the end of the contact hole of the source is set to be longer (preferably by a differential of 1.5–2.0 times longer) than the distance from the end of the contact hole of the collector of the NPN transistor to the end of the contact hole of the emitter, again to promote flow through the NPN transistor.

That is, the effective electrode wire-to-wire distance between the drain and source of the trigger MOS transistor is set to be longer by 2–6 μm than the effective electrode wire-to-wire distance between the collector and emitter of the NPN transistor to promote flow through the NPN transistor.

Hereinbelow, the state of the aforementioned surge current will be described while referring to FIG. 4, which illustrates the operation of the trigger MOS transistor 4 and the NPN transistor 5 monitored with an optical emission microscope after a high voltage pulse generated by a surge generator is applied to the input-output wire 12 shown in FIG. 3. As shown in FIG. 4, the peak voltage of the pulse is 20 V. The withstand voltage of the junction between the drain diffusion layer 16 and the well layer 32 is about 14 V.

Figure 4:
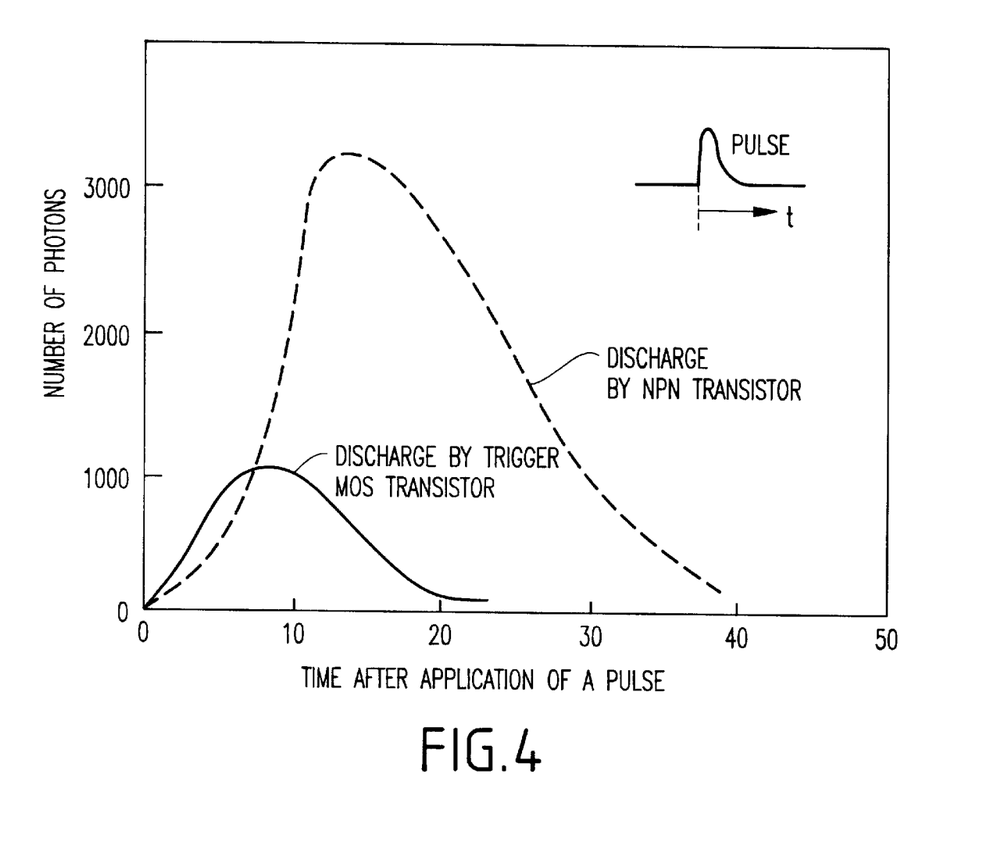
FIG. 4 is a graph illustrating operation of the input-output protection circuit of the present invention, and specifically the relationship between the number of photons and the time after application of a pulse.

The axis of the abscissa (i.e., x-axis) of FIG. 4 represents the time after application of a pulse, and the axis of ordinate (i.e., y-axis) represents the number of photons which are detected from the trigger MOS transistor or the NPN transistor. As shown in FIG. 4, after application of a high voltage pulse, the trigger MOS transistor is first operated, and the operating current peaks in about 8 nsec and thereafter decreases.

In contrast, the operation of the NPN transistor is started a little later (e.g., 1–5 ns after the MOS transistor) than the trigger MOS transistor, and the operating current increases sharply after 10 nsec after application of a pulse. Then, the operating current peaks after about 15 nsec and thereafter decreases.

Thus, in the arrangement of the present invention when a positive high voltage pulse is applied to an input-output terminal, the trigger MOS transistor is first operated, which triggers the start of the NPN transistor. Then, the NPN transistor is operated and an electrostatic discharge is performed. This structure can trigger the NPN before the inner (internal) circuit breaks down. Thus, the speed of the NPN transistor operation increases and is more reliable.

Additionally, the present inventors have conducted tests similar to that of FIG. 4 by changing the spaced distance between an NPN transistor and an MOS transistor which starts the NPN transistor. As a result, it has been confirmed that the spaced distance of the NPN transistor, which is operated by positive holes generated by the operation of the aforementioned breakdown and trigger MOS transistor, spreads with a speed of 0.8 $\mu$m/nsec.

The time until the NPN transistor starts must be substantially about 10 nsec or less, considering the rise time of a normal ESD pulse (e.g., high voltage pulse). In view of this 10 nsec time requirement and the aforementioned spreading speed (i.e., 0.8 $\mu$m/nsec.), the distance between the trigger MOS transistor and the NPN transistor is preferably set to about 8 $\mu$m or less (i.e., 0.8 $\mu$m/nsec×10 nsec=8 $\mu$m).

Additionally, when a negative excessive input voltage is applied to the input-output terminal 1, a forward surge current flows through the PN diode 8 and electrostatic discharge is performed through the PN diode 8.

As described above, in the present invention, if an excessive input voltage is applied to an input-output terminal, then the trigger MOS transistor having a small dimension will be operated first. Then, the NPN transistor is operated and the discharge is performed. In this case, the trigger MOS transistor has a primary role of starting the NPN transistor, not of discharging an excessive input voltage. The discharge of the excessive input voltage is primarily performed through the NPN transistor which becomes a low resistance path.

Hence, in the present invention there is no breakdown of the gate insulation film of the MOS transistor which frequently occurs in the conventional devices such as the first conventional device described above. The reason that there is no gate insulation film breakdown, is that the time when a voltage is applied to the gate insulation film of the trigger MOS transistor is momentary (e.g., extremely small and on the order of about 1–5 ns) and the number of positive holes collected in the gate insulation film is relatively very small.

Figure 5:
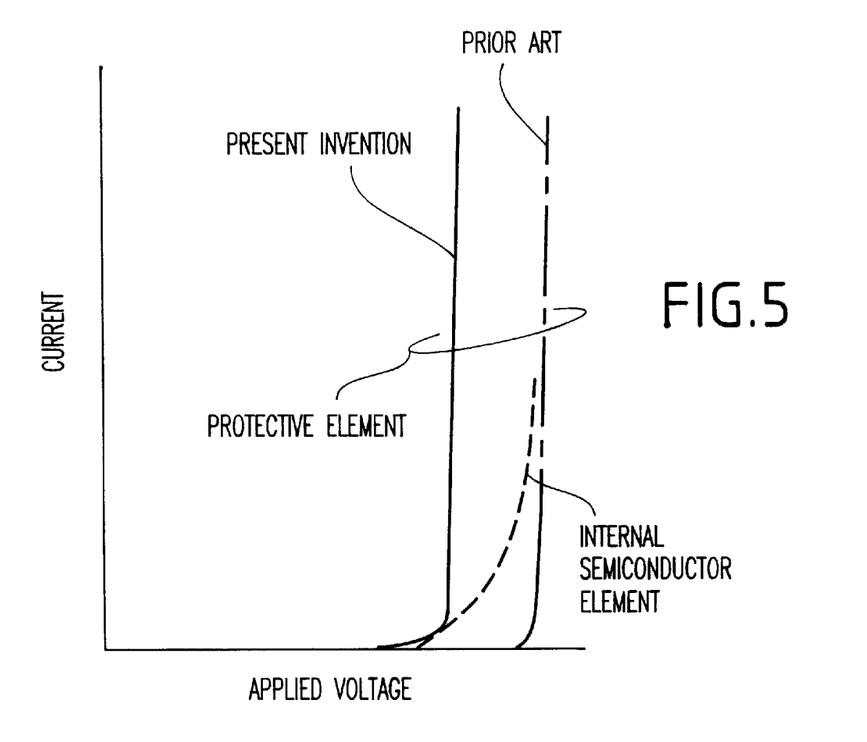
FIG. 5 is a graph illustrating the advantageous effects of the present invention.

Referring to FIG. 5, another advantage of the present invention will be described. FIG. 5 shows the breakdown characteristic for a positive electrostatic discharge. In FIG. 5, the axis of the abscissa (i.e., x-axis) represents the applied voltage of a pulse and the axis of the ordinate (i.e., y-axis) represents the current. In the present invention, the breakdown of protective elements occurs at an applied voltage which is small as compared with the conventional devices, such as the second conventional device described above.

Additionally, the withstand voltage of the gate insulation film of a semiconductor element which forms an internal circuit can be reduced. Hence, in the present invention, an internal semiconductor element which could not be protected in the second conventional example is completely protected by the protective elements of the present invention.

Second Embodiment

Figure 6:
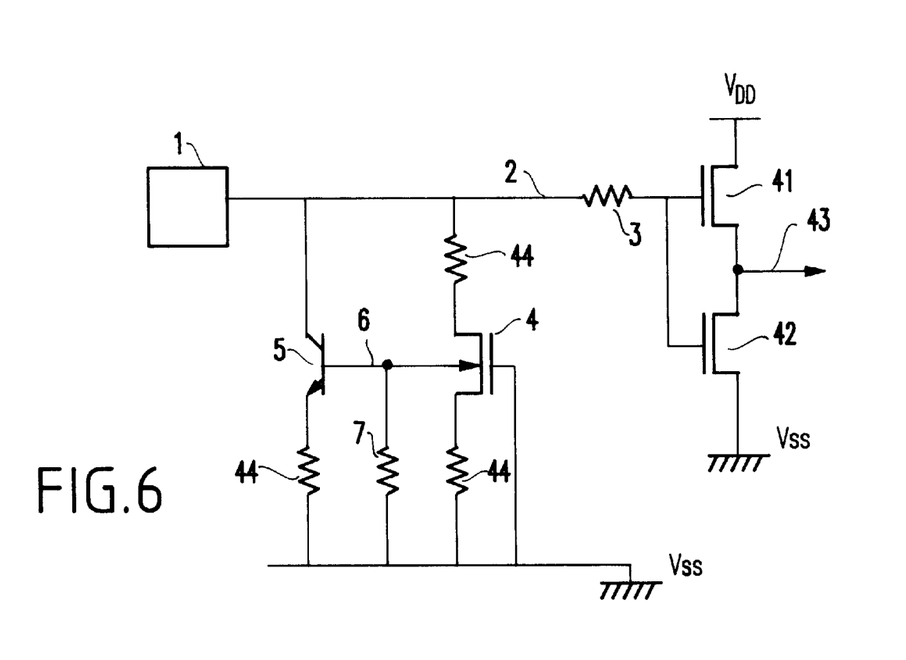
FIG. 6 is a circuit diagram of an input-output protection circuit according to a second embodiment of the present invention.
Figure 7:
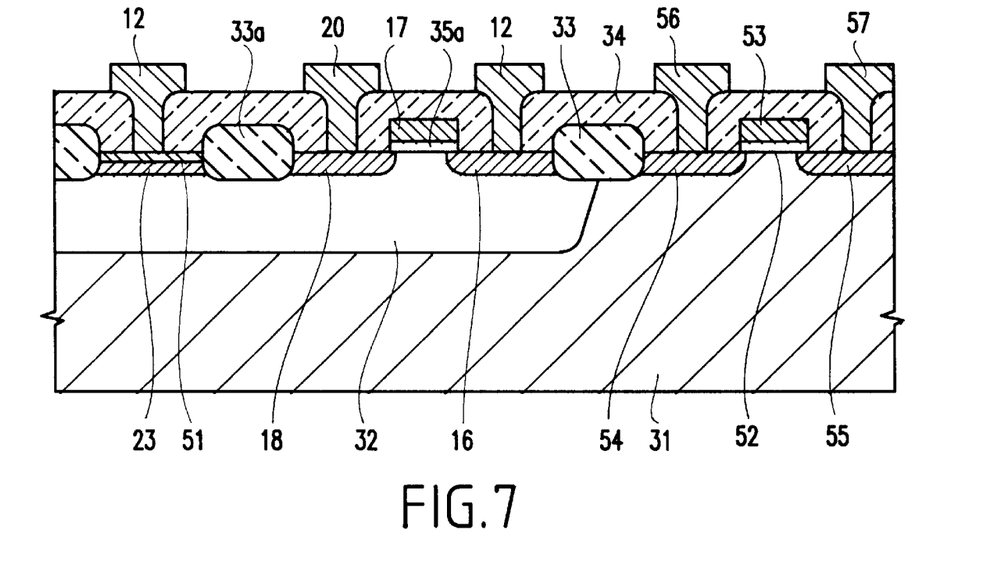
FIG. 7 is a sectional view of the input-output protection circuit of the second embodiment of the present invention.

Hereinbelow, a second embodiment of the present invention will be described with reference to FIGS. 6 and 7. FIG. 6 shows a circuit diagram of an input-output protection circuit and an input circuit diagram, and FIG. 7 is a sectional view similar to FIG. 3.

As shown in FIG. 6, an input-output line 2 is connected to an input-output terminal 1, and through an input resistor 3 to the input gate of the internal circuit of a semiconductor device. That is, the input-output line 2 is connected to the gate of an inverter which is formed by a P-MOS transistor 41 and an N-channel MOS transistor 42. Then, the output line 43 of the internal circuit is connected to another internal circuit.

A trigger MOS transistor 4 is connected between the input-output line 2 and a ground line (e.g., an electric potential of $V_{SS}$). The gate of the trigger MOS transistor 4 is fixed to the $V_{SS}$ potential.

Additionally, on the input-output line 2 an NPN transistor 5 is connected in parallel to the trigger MOS transistor 4. A back gate 6 of the trigger MOS transistor 4 is connected to the base of the NPN transistor 5 through a well layer described below. The back gate 6 also is connected to the $V_{SS}$ potential through a back gate resistor 7. Further, the emitter of the NPN transistor 5 is connected to the $V_{SS}$ potential, and parasitic resistors 44 are formed in the drain and source of the trigger MOS transistor 4 and the emitter of the NPN transistor 5, respectively.

As shown in FIG. 7, similarly to the first embodiment, a well layer 32 in which the conductive-type is preferably a P-channel, is formed on the surface region of a silicon substrate 31 where the conductive-type is an N-channel. Field insulation films 33 are selectively formed on the well layer 32 as an element separating region. A gate electrode 17 is formed through the gate insulation film 35a on a region where there is no field insulation film 33, and a high concentration of arsenic impurities are introduced and a drain diffusion layer 16 and a source diffusion layer 18 are formed. Preferably, the gate insulation film is formed of $SiO_2$ and has a thickness within a range of about 8–12 nm.

Thereafter, an input-output wire 12 is connected to the drain diffusion layer 16 through a contact hole provided in an intervening insulation film 34. A ground wire 20 is connected to the source diffusion layer 18. Hence, the N-channel trigger MOS transistor 4 is formed.

Additionally, a collector diffusion layer 23 is formed with a high concentration of arsenic impurities, and a silicide layer 51 is formed only on the surface of the collector diffusion layer 23. The silicide layer 51 preferably is formed to have a thickness within the range of about 0.1–0.2 $\mu$m. Then, the silicide layer 51 is connected to the input-output wire 12. Thus, an NPN transistor is formed which is a lateral bipolar transistor having the well layer just under the field insulation film 33a as its base region and also having the emitter diffusion layer 18 and the collector diffusion layer 23.

Furthermore, the P-channel MOS transistor 41 which forms the aforementioned inverter is formed on the surface of the silicon substrate. That is, an input gate electrode 53 is formed on the surface of the silicon substrate 31 through an input gate insulation film 52 which preferably has a thickness of 8–12 nm and is formed of $SiO_2$, and an input source diffusion layer 54 and an input drain diffusion layer 55 are formed which contain a high concentration of boron impurities. Thereafter, the input source diffusion layer 54 is connected to a power-supply wire 56 through a contact hole, and the input drain diffusion layer 55 is connected to an output wire 57.

In the above arrangement, the film thickness of the gate insulation film 35a of the trigger MOS transistor is thicker than that of the input gate insulation film 52 which forms the input gate. As a result, the gate insulation breakdown of the trigger MOS transistor is completely protected from an excessive input voltage. For example, the film 35a has a thickness within a range of about 16–24 nm, whereas the preferred thickness of the film 52 is within the range of about 8–12 nm.

In the second embodiment, the parasitic resistor in the collector diffusion layer 23 is considerably reduced (e.g., the resistor has a value of about 5–10 $\Omega/\square$). Therefore, the NPN transistor positively responds to an excessive input voltage faster than an internal semiconductor element (e.g., the inverter). Additionally, the functionality of the input-output protection circuit of the present invention is highly reliable.

Third Embodiment

Hereinbelow, a third embodiment of the present invention will be described with reference to FIG. 8, which is a sectional view of an input-output protection circuit similar to that shown in FIG. 3. In the third embodiment, the gate insulation film of the aforementioned trigger MOS transistor is made even thicker (e.g., approximately 200 nm or preferably in a range of about 100–300 nm).

Figure 8:
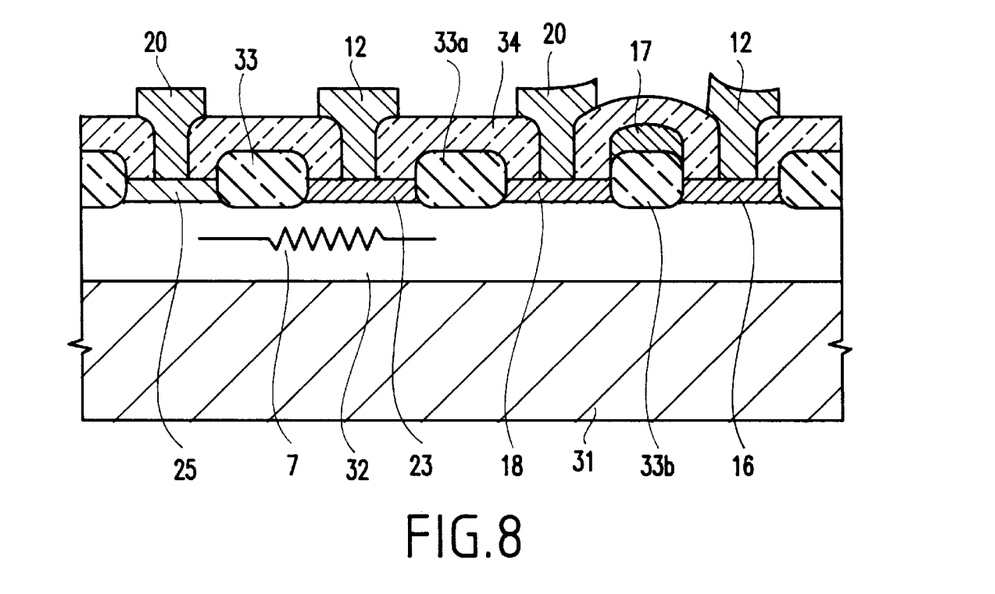
FIG. 8 is a sectional view of an input-output protection circuit according to a third embodiment of the present invention.

As shown in FIG. 8, a well layer 32 where the conductive-type is a P-channel is formed on the surface of an N-channel silicon substrate 31 and preferably has a thickness of 1–5 $\mu$m. The concentration of the impurities of the well layer 32 is set to about $10^{15}$ atoms/cm$^3$.

Thereafter, field insulation films 33, 33a, and 33b, preferably formed of SiO$_2$ and having a thickness of 1–5 $\mu$m, are selectively formed on the surface of the well layer 32. A gate electrode 17 is formed through the field insulation film 33b. A high concentration (e.g., $10^{20}$ atoms/cm$^3$) of arsenic impurities are introduced into the gate electrode 17 in a self-matching manner, and the drain diffusion layer 16 and the source diffusion layer 18 are formed. Layers 16, 18 preferably have a thickness in the range of 0.1–0.3 $\mu$m and 0.1–0.3 $\mu$m, respectively.

Thereafter, the same description as FIG. 3 applies. That is, the input-output wire 12 is connected to the drain diffusion layer 16 through a contact hole provided in an intervening insulation film 34, and a ground wire 20 is connected to the source diffusion layer 18. Hence, the N-channel trigger MOS transistor 4 is formed.

Additionally, a collector diffusion layer 23 is formed with a high concentration (e.g., $10^{20}$ atoms/cm$^3$) of arsenic impurities, and the collector diffusion layer 23 is connected to the input-output wire 12. Hence, an NPN transistor is formed which is a lateral bipolar transistor having the well layer just under the field insulation film 33a as its base region, and also having the emitter diffusion layer 18 and the collector diffusion layer 23.

Furthermore, a diode diffusion layer 25 is formed with a high concentration (e.g., $10^{20}$ atoms/cm$^3$) of boron impurities. The diode diffusion layer 25 is the same P-channel as the well layer 32, and is connected to the ground wire 20. Thus, the PN diode 8 is formed by the collector diffusion layer 23 and well layer 32 which are N$^+$ type diffusion layers.

In this case, the gate insulation film 35a of the trigger MOS transistor is formed by the field insulation film 33b, and the film thickness is set to about 200 nm. Therefore, even when an input voltage is too high (e.g., greater than 5000 V based on the Human Body Model ESD test), the aforementioned insulation breakdown of the gate insulation film is prevented.

It is noted that the gate electrode 17 may be connected to the input-output line 2, instead of the V$_{SS}$ potential.

Fourth Embodiment

Hereinbelow, a fourth embodiment of the present invention will be described while referring to FIG. 9, which shows another pattern layout of the input-output protection circuit. In this embodiment, the trigger MOS transistor actuates the NPN transistor more effectively (i.e., quicker) than in the first embodiment shown in FIG. 2.

Figures 9, 10A, 10B:
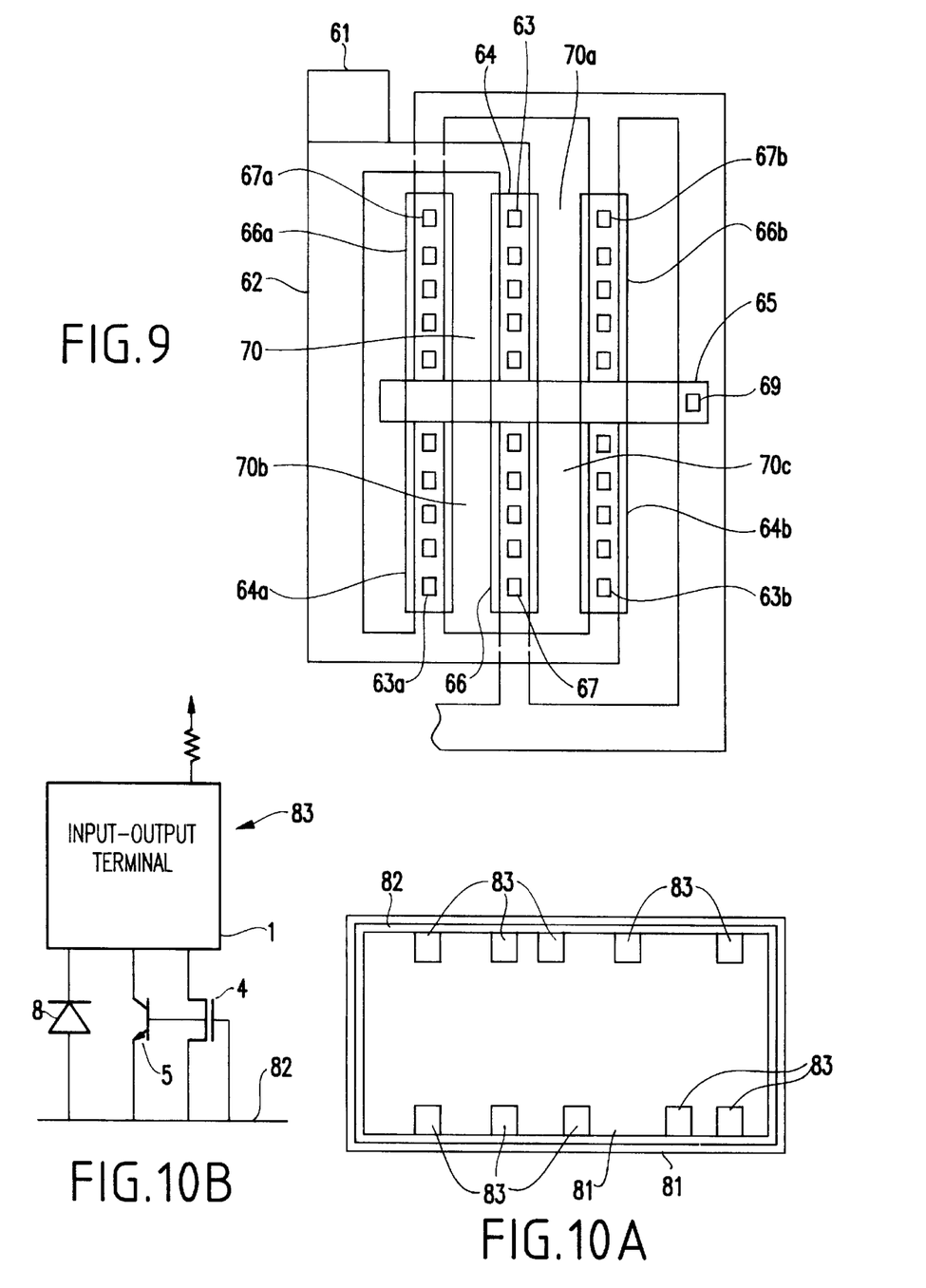
FIG. 9 is a pattern layout diagram of an input-output protection circuit according to a fourth embodiment of the present invention.
FIGS. 10(a) and 10(b) are layout diagrams on a semiconductor chip of the input-output protection circuit according to the present invention.

As shown in FIG. 9, an input-output wire 62, which is connected to an input-output pad 61, is formed. Wire 62 and pad 61 are preferably made of an aluminum alloy. Then, a portion of the input-output wire 62 is connected to an internal wire (not shown) similarly to that described in FIG. 2.

The input-output wire 62 is connected to drain diffusion layers 64, 64a, and 64b through drain contact holes 63, 63a, and 63b, respectively. Drain diffusion layers 64, 64a, and 64b preferably have thickness within the ranges of 0.1–0.3 $\mu$m, 0.1–0.3 $\mu$m, and 0.1–0.3 $\mu$m, respectively, and are formed of an As$^+$-doped layer.

Then, a gate electrode 65 is formed, and source diffusion layers 66, 66a, and 66b are formed at positions opposite to the aforementioned drain diffusion layers across the gate electrode 65, respectively. Source diffusion layers 66, 66a, and 66b preferably have a thickness within the ranges of 0.1–0.3 $\mu$m, 0.1–0.3 $\mu$m, and 0.1–0.3 $\mu$m, respectively, and are formed of an As$^+$-doped layer. The gate electrode and the source diffusion layers form three trigger MOS transistors. The source diffusion layers 66, 66a, and 66b are connected to a ground wire 68 through source contact holes 67, 67a, and 67b. The gate electrode 65 is connected to the ground wire 68 through a gate contact hole 69.

In the above arrangement, an NPN transistor is constructed such that the drain diffusion layer 64 functions as its collector diffusion layer and the source diffusion layers 66a and 66b function as its emitter diffusion layer and its also has base regions 70 and 70a. Furthermore, a second NPN transistor is constructed such that the drain diffusion layers 64a and 64b function as its collector diffusion layer and the source diffusion layer 66 functions as its emitter diffusion layer and it also has base regions 70b and 70c.

In the fourth embodiment, a region (e.g., the channel end of the trigger MOS transistor) where positive holes are generated and the base region are adjacent to each other. Hence, the aforementioned positive holes formed in the trigger MOS transistor region are diffused more effectively (i.e., the number of holes are larger, and the number of breakdown points are larger) into the base region of the NPN transistor. Additionally, the operation of the NPN transistor is faster than that of FIG. 2 and the protective ability is further enhanced.

Next, an example of the input-output protection portions/circuits of the present invention and their disposition on a semiconductor chip will be described referring to FIGS. 10(a) and 10(b). FIG. 10(a) is a plan view of a semiconductor chip, and FIG. 10(b) is a circuit diagram of an input-output protection portion/circuit.

As shown in FIG. 10(a), a predetermined number of input-output protection portions 83 are wired around the periphery of a semiconductor chip 81. Each input-output protection portion 83 is connected to an input-output terminal 1 and a common discharge line 82 so that a trigger MOS transistor 4, an NPN transistor 5, and a PN diode 8 become parallel to one another, as shown in FIG. 10(b). A wire is connected from the input-output terminal 1 to an internal circuit.

The common discharge line 82 is provided along the scribed (e.g., marked or cut) line of the semiconductor chip 81, as shown in FIG. 10(a). The common discharge line 82 is fixed to a constant electric potential, such as −3V which is generated by the back bias generator circuit. For example, the common discharge line 82 is made of aluminum metal and is connected to a silicon substrate at the region of the scribed line. The electric potential of the silicon substrate depends upon a semiconductor device which is mounted on a semiconductor chip, but generally it is held to a fixed electric potential.

For example, when a semiconductor device is a static random access memory (SRAM), the silicon substrate potential is fixed to a ground potential. When the semiconductor device is a dynamic random access memory (DRAM), the silicon substrate potential is fixed to a negative constant potential. In this case, generally a silicon substrate where the conductive-type is a P-channel is employed.

In the aforementioned disposition of the common discharge line 82, even if an excessive input voltage were applied to an input-output terminal, the surge current corresponding to the excessive input voltage would flow through the input-output protection portion to the common discharge line 82. Therefore, the excessive input voltage has no effect on the internal circuit.

While in the above embodiments according to the present invention, the trigger MOS transistor has been described as an N-channel type, the trigger MOS transistor is not limited to the N channel type and, even in the case of a P-channel-type, the transistor can be formed similarly. In this case, the conductive-type is reversed and then a design is made. Additionally, instead of the aforementioned positive hole an electron acts similarly as the positive hole.

Additionally, in the embodiments the input-output protection portion has been described as being formed in the input-output terminal so that the internal circuit of the semiconductor device is protected. However, the advantageous effects of the present invention is not limited to such an arrangement, and indeed the same advantageous effects are obtainable even when the input-output protection portion is connected to the power supply terminal or ground terminal of a semiconductor device.

As described above, as the semiconductor element of the semiconductor device is made smaller (e.g., made more highly integrated) and the parasitic resistor or parasitic quantity is reduced, the effect of application of the present invention to the power supply terminal or ground terminal becomes apparent. Additionally, in this case the present invention has the advantage that the semiconductor element which forms the internal circuit of the semiconductor device can be prevented from being latched up. Specifically, with this structure, the first breakdown point (e.g., the position under the trigger MOSFET gate) is positioned at the NPN base region, and thus the trigger current most likely activates the protection NPN. This causes the internal parasitic NPN or PNPN action (e.g., the latch-up).

Additionally, in the above embodiments, it has been described that, when an excessive input voltage is applied to an input-output terminal, the trigger MOS transistor is actuated due to the breakdown of the PN junction (e.g., the channel end of the trigger MOS transistor) just under the gate insulation film. However, the present invention is not to be limited to such a mechanism. In the present invention, the positive holes which are generated due to the punch-through between the source and drain of the trigger MOS transistor may have a role in the aforementioned actuation. Thus, the punch-through voltage is simply controlled with the length of the gate electrode. Hence, a reduction in the punch-through voltage becomes very simple and therefore a mechanism for reducing the voltage of a semiconductor device becomes even easier.

Further, while in the embodiments of the present invention it has been described that the trigger MOS transistor actuates the NPN transistor, a semiconductor element for actuating the NPN transistor is not limited to the MOS transistor. If a semiconductor element generates a great number of carriers, it can be employed.

For example, instead of the trigger MOS transistor, even an element such as a gate control diode can have the same advantages. However, in this case, it is difficult to cope with a reduction in the voltage by making use of the punch-through operation.

Additionally, the layout of the trigger MOS transistor and the NPN transistor is not limited to that shown in FIGS. 2 or 9. The transistors should be disposed in adjacent regions. Moreover, it is beneficial if a portion of another semiconductor element, such as a gate portion, a contact portion or a diffusion portion, is not provided between the semiconductor element which generates a great number of carriers and the NPN transistor.

Finally, while the well layer has been employed in the embodiments of the present invention, this layer is not always needed. Thus, the electrostatic protection elements of the present invention may be formed directly on the silicon substrate.

With the unique and unobvious structure of the input-output protection portion of the present invention, a semiconductor element such as a trigger MOS transistor and an electrostatic protection transistor, such as an NPN transistor, are connected in parallel between a terminal and a common discharge line. Accordingly, the drain of the trigger MOS transistor and the collector of the NPN transistor are connected to the aforementioned terminal. Additionally, the gate and source of the trigger MOS transistor and the emitter of the NPN transistor are connected to the common discharge line.

Further, the back gate of the trigger MOS transistor is preferably connected to the common discharge line through the parasitic resistor connected to the base of the NPN transistor. Moreover, the dimension of the trigger MOS transistor is preferably smaller than that of the NPN transistor. For example, the gate width is designed so that it is no more than $\frac{1}{10}$ of the base width.

With this arrangement, when an excessive input voltage is applied to a terminal, a semiconductor element, such as a trigger MOS transistor having a small dimension, is operated (e.g., actuated) first. This semiconductor element in turn actuates an electrostatic protection transistor such as an NPN transistor. The surge current which corresponds to the excessive input voltage is discharged to the common discharge line through an electrostatic protection transistor such as an NPN transistor where the discharge resistance is high. With such an arrangement, the insulation breakdown of the gate insulation film of the electrostatic protection transistor, found in the conventional devices, is prevented.

Furthermore, an excessive input voltage is prevented from operating the semiconductor element of an internal circuit earlier than the input-output protection portion. Additionally, the input-output protection portion of the present invention sufficiently responds to a small quantity (e.g., 10–15 V) of static electricity. With these, even a semiconductor element which forms a high-density internal circuit can be completely and reliably prevented from an electrostatic breakdown.

Moreover, in the arrangement of the present invention, the voltage of a semiconductor device can be easily reduced because even a low voltage easily operates an electrostatic protection element. Thus, the present invention reliably protects a semiconductor device from an ESD breakdown which may frequently occur. Additionally, the present invention produces a highly-integrated, high-speed semiconductor.

Further, as described in the embodiments above, the invention provides an efficient and compact semiconductor device pattern layout for achieving the above-described advantages. As shown in the drawings and as described above, the layout includes a first region coupled to a terminal, a second region coupled to a discharging line, a gate electrode cooperating with the first and second regions, to provide a metal oxide semiconductor (MOS) transistor, and a third region coupled to the terminal and provided adjacent to the MOS transistor. Another semiconductor device pattern layout, includes a first region coupled to a terminal, a second region coupled to a discharging line, a gate electrode coupled between the first and second regions, and a third region provided one of adjacent the first region and adjacent the second region.

While the invention has been described in terms of several preferred embodiments, those skilled in the art will recognize that the invention can be practiced with modification within the spirit and scope of the appended claims.

Having thus described our invention, what we claim as new and desire to secure by Letters Patent is as follows:

1. A semiconductor device having a semiconductor substrate having a terminal, and a protection circuit, said protection circuit comprising:

a field-effect transistor (FET) comprising at least one first diffusion layer of a first conductive-type formed on a region of said semiconductor substrate, said region being a second conductive-type region, said at least one diffusion layer being connected to said terminal, said FET further comprising at least one second diffusion layer of said first conductive-type connected to an electrode, said electrode having a constant electric potential and said FET having a first portion of said first diffusion layer as a drain, a first portion of said second diffusion layer as a source and a gate electrode connected to said electrode; and a bipolar transistor in which a second portion of said first diffusion layer is a predetermined distance from a second portion of said second diffusion layer, wherein said source is positioned between said second portion of the first diffusion layer and said first portion of the first diffusion layer;

said bipolar transistor including said second portion of said first diffusion layer as a collector, said second portion of said second diffusion layer as an emitter, and said second conductive-type region as a base.

2. The semiconductor device as set forth in claim 1, wherein said FET comprises an insulated gate field-effect transistor (IGFET) and said bipolar transistor comprises a lateral bipolar transistor, and wherein said terminal comprises one of an input terminal and output terminal for connecting an external circuit to an internal circuit of said semiconductor substrate and said insulated gate field-effect transistor and said lateral bipolar transistor comprise electrostatic protection elements.

3. The semiconductor device as set forth in claim 1, wherein said FET comprises an insulated gate field-effect transistor (IGFET) and said bipolar transistor comprises a lateral bipolar transistor, and wherein said terminal is connected to one of a power supply of the semiconductor device, a ground potential and an input-output terminal, said insulated gate field-effect transistor and said lateral bipolar transistor comprising electrostatic protection elements.

4. The semiconductor device as set forth in claim 2, wherein when an excessive input voltage is applied to said terminal, said lateral bipolar transistor is operated by an electrical charge generated due to an electrical flow between the drain and source of said insulated gate field-effect transistor.

5. The semiconductor device as set forth in claim 2, wherein said gate of said insulated gate field-effect transistor has a width less than that of said base of said lateral bipolar transistor.

6. The semiconductor device as set forth in claim 2, wherein said insulated gate field-effect transistor has a channel length greater than that of a base of said lateral bipolar transistor.

7. The semiconductor device as set forth in claim 2, wherein a first distance between ends of contact holes of said drain and said source of said insulated gate field-effect transistor is longer than a second spaced distance between ends of contact holes of said collector and said emitter of said lateral bipolar transistor.

8. The semiconductor device as set forth in claim 2, wherein said insulated gate field-effect transistor includes a channel end partially connected to said base of said lateral bipolar transistor.

9. The semiconductor device as set forth in claim 2, wherein a first distance between a channel end of said insulated gate field-effect transistor and said base of said lateral bipolar transistor is approximately 8 $\mu$m.

10. The semiconductor device as set forth in claim 2, wherein said second conductive-type region comprises a well layer formed on said semiconductor substrate.

11. The semiconductor device as set forth in claim 2, wherein said electrode is for discharging an excessive input voltage and is disposed around the periphery of said semiconductor substrate.

12. A semiconductor device including a semiconductor substrate having a terminal, and a protection circuit, said protection circuit comprising:

a field-effect transistor (FET) including a first diffusion layer of a first conductive-type formed on a region of said semiconductor substrate, said region being a second conductive-type region, said first diffusion layer being connected to said terminal, said first diffusion layer forming a drain of said FET, and said FET further including a second diffusion layer of said first conductive-type connected to an electrode, said electrode having a constant electric potential, said second diffusion layer forming a source of said FET, said FET further including a gate electrode connected to said electrode, and a bipolar transistor including a third diffusion layer of said first conductive-type positioned a predetermined distance from said second diffusion layer and said bipolar transistor being connected to said terminal, wherein said source is positioned between said third diffusion layer and said first diffusion layer, said terminal comprising a collector of said bipolar transistor, said second diffusion layer comprising an emitter of said bipolar transistor, and said second conductive-type region comprising a base of said bipolar transistor.

13. The semiconductor device as set forth in claim 12, wherein said FET comprises an insulated-gate FET (IGFET) and said bipolar transistor comprises a lateral bipolar transistor, said device further including a PN diode comprising a fourth diffusion layer of said first conductive-type, a first portion of said fourth diffusion layer being positioned a second predetermined distance from said third diffusion layer and a second portion of said fourth diffusion layer being connected to said electrode and said third diffusion layer.

14. A semiconductor device, comprising:

a semiconductor substrate;

a bipolar transistor formed on said substrate and including first and second diffusion layers, formed in said semiconductor substrate, for forming a collector and an emitter, respectively, a portion of said semiconductor substrate forming a base of said bipolar transistor, said collector being connected to a metal terminal and said emitter being connected to an electrode having a constant electric potential; and a field effect transistor (FET), connected to said substrate, for actuating said bipolar transistor upon a predetermined voltage being applied to said device, said FET including a third diffusion layer as a drain, said second diffusion layer as a source and coupled to said electrode, and a gate electrode coupled to said electrode;

wherein said source is positioned between said third diffusion layer and said first diffusion layer.

15. The semiconductor device as set forth in claim 14, wherein said electrostatic protection transistor comprises a lateral bipolar transistor.

16. The semiconductor device as set forth in claim 14, wherein said semiconductor element comprises an insulated gate field-effect transistor (IGFET). diffusion layer.

17. The semiconductor device as set forth in claim 14, wherein said semiconductor element further comprises a gate control diode.

* * * * *